United States Patent
Yamamoto et al.

(10) Patent No.: US 11,557,688 B2
(45) Date of Patent: *Jan. 17, 2023

(54) SOLAR CELL, MULTI-JUNCTION SOLAR CELL, SOLAR CELL MODULE, AND SOLAR POWER GENERATION SYSTEM

(71) Applicants: KABUSHIKI KAISHA TOSHIBA, Minato-ku (JP); TOSHIBA ENERGY SYSTEMS & SOLUTIONS CORPORATION, Kawasaki (JP)

(72) Inventors: Kazushige Yamamoto, Yokohama (JP); Soichiro Shibasaki, Nerima (JP); Mutsuki Yamazaki, Yokohama (JP); Yuya Honishi, Yokohama (JP)

(73) Assignees: KABUSHIKI KAISHA TOSHIBA, Minato-ku (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 194 days.

This patent is subject to a terminal disclaimer.

(21) Appl. No.: 16/567,684

(22) Filed: Sep. 11, 2019

(65) Prior Publication Data
US 2020/0006589 A1    Jan. 2, 2020

Related U.S. Application Data

(63) Continuation of application No. PCT/JP2018/002790, filed on Jan. 29, 2018.

(51) Int. Cl.
*H01L 31/0725* (2012.01)
*H01L 31/0216* (2014.01)
(Continued)

(52) U.S. Cl.
CPC .... *H01L 31/0725* (2013.01); *H01L 31/02167* (2013.01); *H01L 31/022425* (2013.01);
(Continued)

(58) Field of Classification Search
CPC ............... H01L 31/0725; H01L 31/072; H01L 31/02167; H01L 31/022425;
(Continued)

(56) References Cited

U.S. PATENT DOCUMENTS

2006/0226767 A1* 10/2006 Tyan .................... H01L 51/5265
313/504
2009/0194157 A1* 8/2009 den Boer ............ H01L 31/0236
136/256
(Continued)

FOREIGN PATENT DOCUMENTS

CN    103137717 A   *  6/2013
JP     62-73782 A       4/1987
(Continued)

OTHER PUBLICATIONS

Nordseth, Optical Analysis of a ZnO/Cu2O Subcell in a Silicon-Based Tandem Heterojunction Solar Cell, Green and Sustainable Chemistry, Feb. 2017, 7, 57-69 (Year: 2017).*
(Continued)

*Primary Examiner* — Devina Pillay
(74) *Attorney, Agent, or Firm* — Oblon, McClelland, Maier & Neustadt, L.L.P.

(57) ABSTRACT

A solar cell of an embodiment includes: a substrate; an n-electrode; an n-type layer; a p-type light absorption layer which is a semiconductor of a Cu-based oxide; and a p-electrode. The n-electrode is disposed between the substrate and the n-type layer. The n-type layer is disposed between the n-electrode and the p-type light absorption layer. The p-type light absorption layer is disposed between the n-type layer and the p-electrode. The n-type layer is disposed closer to a light incident side than the p-type light absorption layer. The substrate is a single substrate included in the solar cell.

17 Claims, 9 Drawing Sheets

(51) Int. Cl.
    *H01L 31/0224* (2006.01)
    *H01L 31/032* (2006.01)
    *H01L 31/075* (2012.01)
    *H01L 31/072* (2012.01)

(52) U.S. Cl.
    CPC ........ *H01L 31/0322* (2013.01); *H01L 31/072* (2013.01); *H01L 31/075* (2013.01)

(58) Field of Classification Search
    CPC . H01L 31/0322; H01L 31/075; H01L 31/043; H01L 31/0336; H01L 25/043; H01L 31/046; H01L 31/032; Y02E 10/548; Y02E 10/541
    See application file for complete search history.

(56) References Cited

U.S. PATENT DOCUMENTS

| | | |
|---|---|---|
| 2011/0048493 A1 | 3/2011 | Yun et al. |
| 2012/0097227 A1 | 4/2012 | Lim et al. |
| 2019/0198697 A1 | 6/2019 | Honishi et al. |

FOREIGN PATENT DOCUMENTS

| | | | |
|---|---|---|---|
| JP | 62-93804 A | | 4/1987 |
| JP | 2000-243994 A | | 9/2000 |
| JP | 2003-282897 A | | 10/2003 |
| JP | 2005-239526 A | | 9/2005 |
| JP | 2006332373 A | * | 12/2006 |
| JP | 2011-54971 A | | 3/2011 |
| JP | 2012-186415 A | | 9/2012 |
| JP | 2014-170865 A | | 9/2014 |
| JP | 2014-183244 A | | 9/2014 |
| JP | 2017059656 A | * | 3/2017 |
| JP | 2017-98479 A | | 6/2017 |
| JP | 3220083 U | | 2/2019 |
| JP | 2019-57536 A | | 4/2019 |

OTHER PUBLICATIONS

JP-2006332373-A, Machine Translation (Year: 2006).*
JP-2017059656-A, Machine Translation, Mar. 2017 (Year: 2017).*
CN-103137717-A, He, Machine Translation (Year: 2013).*
International Search Report dated Apr. 10, 2018 in PCT/JP2018/002790 filed Jan. 29, 2018 (with English translation).
Minami, T, et al. "High-efficiency solar cells fabricated using oxide semiconductors," Applied Physics, vol. 86, No. 8, 2017, 6 pages (with English translation).
Yuki Nishi, "A Study of High-Efficiency Heterojunction Solar Cells Using a $Cu_2O$ Sheets as p-type Oxide semiconductor Layer", Kenjiro Takayanagi Foundation, Jan. 2017, 24 pages (with English translation).
Tadatsugu Minami, et al., "$Cu_2O$-based solar cells using oxide semiconductors", Journal of Semiconductors, vol. 37, No. 1, 2016, 10 pages.
Tadatsugu Minami, et al., "Efficiency enhancement using a $Zn_{1-x}Ge_x$–O thin film as an n-type window layer in $Cu_2O$-based heterojunction solar cells", Applied Physics Express 9, 052301, 2016, 5 pages.
Gurpreet Kaur, et al.,"Localized surface plasmon induced enhancement of electron-hole generation with silver metal island at n-Al:ZnO/p-$Cu_2O$ heterojunction", Applied Physics Letters 107, 053901, 2015, 6 pages.
Yun Seog Lee, et al., "Atomic Layer Deposited Gallium Oxide Buffer Layer Enables 1.2 V Open-Circuit Voltage in Cuprous Oxide Solar Cells", Advanced Materials, 2014, 26, pp. 4704-4710.
Wilman Septina, et al., "Potentiostatic electrodeposition of cuprous oxide thin films for photovoltaic applications", Electrochemica Acta 56, (2011) pp. 4882-4888.
G. Riveros, et al.."Effect of Chloride Ions on the structural, optical, morphological, and electrochemical . . . ," J. Chil. Chem. Soc., 61, No. 4 (2016), 5 pages.
U.S. Appl. No. 16/289,711, filed Mar. 1, 2019, US2019/0198697, Honishi, Y., et al.

* cited by examiner

SOLAR CELL, MULTI-JUNCTION SOLAR CELL, SOLAR CELL MODULE, AND SOLAR POWER GENERATION SYSTEM

CROSS-REFERENCE TO RELATED APPLICATION

This application is a continuation application based upon and claims the benefit of priority from International Application PCT/JP2018/002790, the International Filing Date of which is Jan. 29, 2018 the entire contents of which are incorporated herein by reference.

FIELD

Embodiments described herein relate generally to a solar cell, a multi-junction solar cell, a solar cell module, and a solar power generation system.

BACKGROUND

A thin-film type $Cu_2O$ solar cell of a related art in a substrate configuration generates a small amount of power when sunlight is injected from the p-electrode side. Light needs to be injected from the n-electrode side to obtain sufficient power generation, so that it is inevitable to dispose another glass on the n-electrode as a transparent sealing material that transmits sunlight, but this causes an increase of cost and weight.

DETAILED DESCRIPTION

A solar cell of an embodiment includes: a substrate; an n-electrode; an n-type layer; a p-type light absorption layer which is a semiconductor of a Cu-based oxide; and a p-electrode. The n-electrode is disposed between the substrate and the n-type layer. The n-type layer is disposed between the n-electrode and the p-type light absorption layer. The p-type light absorption layer is disposed between the n-type layer and the p-electrode. The n-type layer is disposed closer to a light incident side than the p-type light absorption layer. The substrate is a single substrate included in the solar cell.

Hereinafter, a preferred embodiment of the disclosure will be described in detail with reference to the accompanying drawings.

First Embodiment

Figure 1:
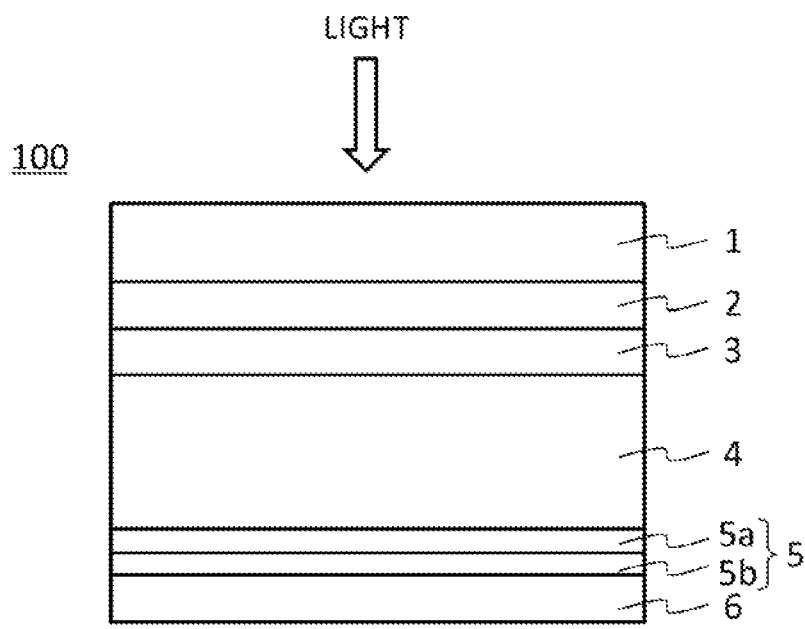
FIG. 1 shows a cross-sectional view of a solar cell according to an embodiment.

A first embodiment relates to a solar cell. FIG. 1 shows a cross-sectional view of a solar cell 100 of a first embodiment. As shown in FIG. 1, the solar cell 100 according to the present embodiment includes a substrate 1, an n-electrode 2, an n-type layer 3, a p-type light absorption layer 4, a p-electrode 5, and a sealing layer 6. The p-electrode 5 preferably includes a first p-electrode 5a and a second p-electrode 5b. An intermediate layer not shown may be included between, for example, the n-type layer 3 and the n-electrode 2. Sunlight may be injected from either the n-electrode 2 side or the p-electrode 5 side, but preferably is injected from the n-electrode 2 side. A substrate not shown may be provided on the p-electrode 5 side or the n-electrode 2 side.

The substrate 1 is a plate-like glass substrate. For the substrate 1, it is desirable to use white plate glass. Alternatively, all glasses including quartz, soda-lime glass, chemically strengthened glass, and the like can also be used. The substrate 1 is a single substrate included in the solar cell 100. Therefore, the solar cell 100 includes only one plate-like glass including the substrate 1, and at least one and not more than one substrate 1, that is, the plate-like glass, is included in the solar cell 100. The substrate 1 is disposed closer to the light incident side than the n-electrode 2, the n-type layer 3, the p-type light absorption layer 4, the p-electrode 5 and the sealing layer 6 are.

The n-electrode 2 is the electrode disposed on the n-type layer 3 side and is light transmissive to visible light. The n-electrode 2 is disposed between the substrate 1 and the n-type layer 3. The n-electrode 2 is disposed closer to the light incident side than the n-type layer 3, the p-type light absorption layer 4 and the p-electrode 5 are. Preferably, a transparent conductive oxide film is used for the n-electrode 2. Preferably, the transparent conductive oxide film used in the n-electrode 2 is at least one kind of transparent conductive film made of a material selected from the group consisting of indium tin oxide (ITO), aluminum-doped zinc oxide (AZO), boron-doped zinc oxide (BZO), gallium-doped zinc oxide (GZO), indium-doped zinc oxide (IZO), aluminum gallium oxide (AGO), titanium-doped indium oxide (ITiO), indium gallium zinc oxide (IGZO), and hydrogen-doped indium oxide ($In_2O_3$).

A thickness of the n-electrode 2 is determined by observing its cross-section with an electron microscope or a step gauge, and is typically at least 1 nm and not more than 2 μm, although not particularly limited.

Preferably, the n-electrode 2 is formed by, for example, sputtering.

The n-type layer 3 is an n-type semiconductor layer. The n-type layer 3 is disposed between the n-electrode 2 and the p-type light absorption layer 4. The n-type layer 3 is disposed closer to the light incident side than the p-type light absorption layer 4 and the p-electrode 5 are. The n-type layer 3 is in direct contact with the surface of the p-type light absorption layer 4 opposite to the surface in contact with the first p-electrode 5a. An intermediate layer not shown can be provided between the n-type layer 3 and the n-electrode 2. Preferably, the n-type layer 3 includes an oxide layer or a sulfide layer. More specifically, the oxide layer used for the n-type layer 3 is preferably selected from the group consisting of $Zn_{(1-x)}A_xO_y$ (A=Si, Ge, Sn), $Cu_{(2-x)}M_xO$ (M=Mn, Mg, Ca, Zn, Sr, Ba), and $Al_{(2-x)}Ga_xO_3$. Preferably, the sulfide layer used for the n-type layer is a layer composed of one or more kinds of sulfides selected from the group consisting of $Zn_xIn_{(2-2x)}S_{(3-2x)}$, ZnS, and $In_xGa_{(1-x)}S$. When $Zn_{(1-x)}A_xO_y$ is used for the n-type layer, a composition ratio of Zn to A is preferably in the range of 0.25 to 8, more preferably 1.5 to 6, more preferably 1 to 3, and more preferably 1.5 to 2.5.

Preferably, a thickness of the n-type layer 3 is at least 5 nm and not more than 100 nm. If the thickness of the n-type layer 3 is not more than 5 nm, a leak current occurs, which is not preferable, if the coverage of the n-type layer 3 is poor. If the thickness of the n-type layer 3 exceeds 100 nm, the transmittance decreases and the short circuit current decreases, which is not preferable. More preferably, therefore, the thickness of the n-type layer 3 is at least 10 nm and not more than 50 nm. Further, to achieve a film with good coverage, the surface roughness of the n-type layer 3 is preferably not more than 5 nm.

Preferably, the n-type layer 3 is formed, for example, by sputtering.

The p-type light absorption layer 4 is a p-type semiconductor layer. The p-type light absorption layer 4 is disposed between the n-type layer 3 and the p-electrode 5 (or the first p-electrode 5a). The p-type light absorption layer 4 is a semiconductor layer made of a Cu-based metal oxide. The Cu-based metal oxide is cuprous oxide or a composite oxide of cuprous oxide. The Cu-based metal oxide includes at least 60.0 atom % and not more than 67.0 atom % of Cu, and at least 32.5 atom % and not more than 34.0 atom % of O (oxygen). The composite oxide of cuprous oxide includes metals other than Cu. The metal included in the composite oxide of cuprous oxide is at least one kind of metal selected from the group consisting of Sn, Sb, Ag, Li, Na, K, Cs, Rb, Al, Ga, In, Zn, Mg, and Ca, other than Cu. If at least one kind of metal selected from the group consisting of Ag, Li, Na, K, Cs, Rb, Al, Ga, In, Zn, Mg, and Ca is included other than Cu, it is possible to adjust the band gap of the p-type light absorption layer 4. Preferably, the band gap of the p-type light absorption layer 4 is at least 2.0 eV and not more than 2.2 eV. With this range of band gap, it is possible to use sunlight efficiently in both top and bottom cells of the multi-junction solar cell in which the bottom cell is the solar cell using Si in the light absorption layer and the top cell is the solar cell of the present embodiment. The p-type light absorption layer 4 may further include Sn or Sb. In the p-type light absorption layer 4, Sn or Sb may be added, or may be derived from the p-electrode 1. The p-type light absorption layer 4 is an oxide layer represented by $Cu_aM_bO_c$. M is at least one kind of metal selected from the group consisting of Ag, Li, Na, K, Cs, Rb, Al, Ga, In, Zn, Mg, and Ca. Preferably, a, b, and c satisfy $1.80 \leq a \leq 2.01$, $0.00 \leq b \leq 0.20$, and $0.98 \leq c \leq 1.02$, respectively. The composition ratio of the p-type light absorption layer 4 is the composition ratio of the entire p-type light absorption layer 4. Preferably, the compound composition ratio of the p-type light absorption layer 4 described above is satisfied in the entire p-type light absorption layer 4. A high concentration of Sn and Sb in the p-type light absorption layer increases defects and causes carrier recombination. Preferably, therefore, the total volume concentration of Sb and Sn in the p-type light absorption layer 4 is equal to or smaller than $1.5 \times 10^{19}$ atoms/cm$^3$.

Figure 2:
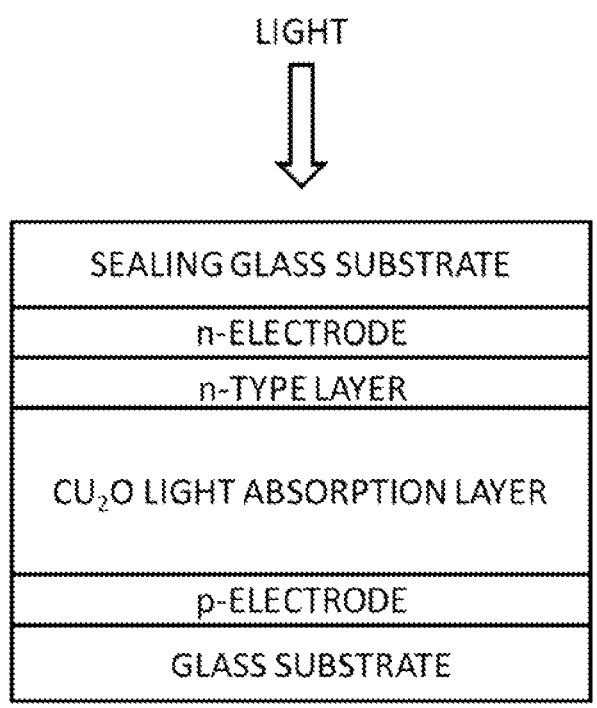
FIG. 2 shows a cross-sectional view of the solar cell.

FIG. 2 shows a cross-sectional view of a solar cell of a substrate configuration of a related art in which light is injected from the n-electrode side. Power generation mechanism in a configuration of a related art in which the sunlight is injected from the n-electrode side is described. First, the light is absorbed in the $Cu_2O$ light absorption layer at a position close to a p-n junction region to generate electron-hole pairs. The electron-hole pairs diffuse to the p-n junction region and dissociates into free electrons and free holes due to potential gradient to generate free carriers. Next, the dissociated free electrons and free holes are diffused to the n-electrode and the p-electrode, respectively, along the potential gradient and taken out from the electrodes as the electric power. With the above process having been accomplished, the light energy can be taken out externally from the element as the electric power. In other words, the power generation is accomplished through the above mechanism. Our study has found that the efficient power generation can be achieved, with the light injected from the n-electrode side, when diffusion length D>absorption length L, where L is an absorption length of light (or a distance at which the light intensity becomes 1/e), and is a diffusion length of electron-hole pairs, so that many electron-hole pairs can reach the p-n junction region and dissociate into free carriers. However, the sealing glass substrate is provided on the n-electrode side in addition to the glass substrate on the p-electrode side, thus causing an increase in the cost and the weight of the solar cell.

Figure 3:
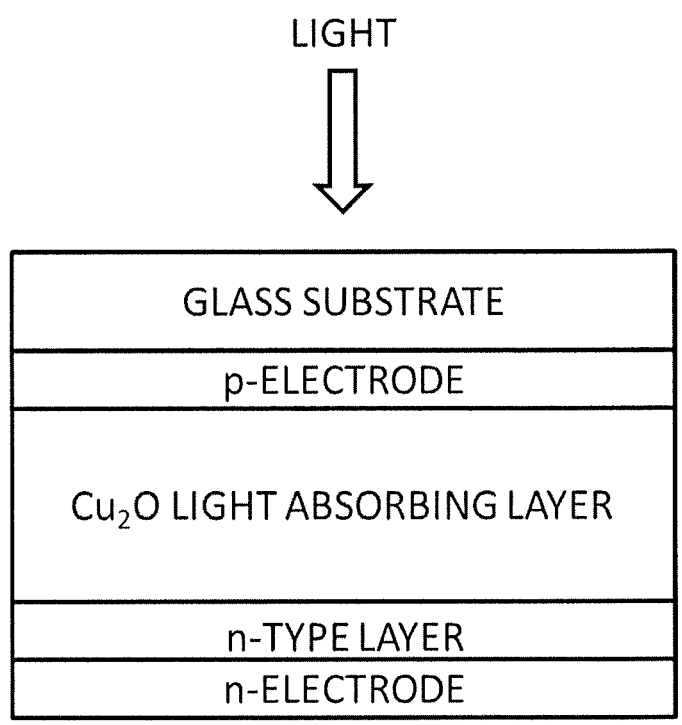
FIG. 3 shows a cross-sectional view of the solar cell.
Figure 4:
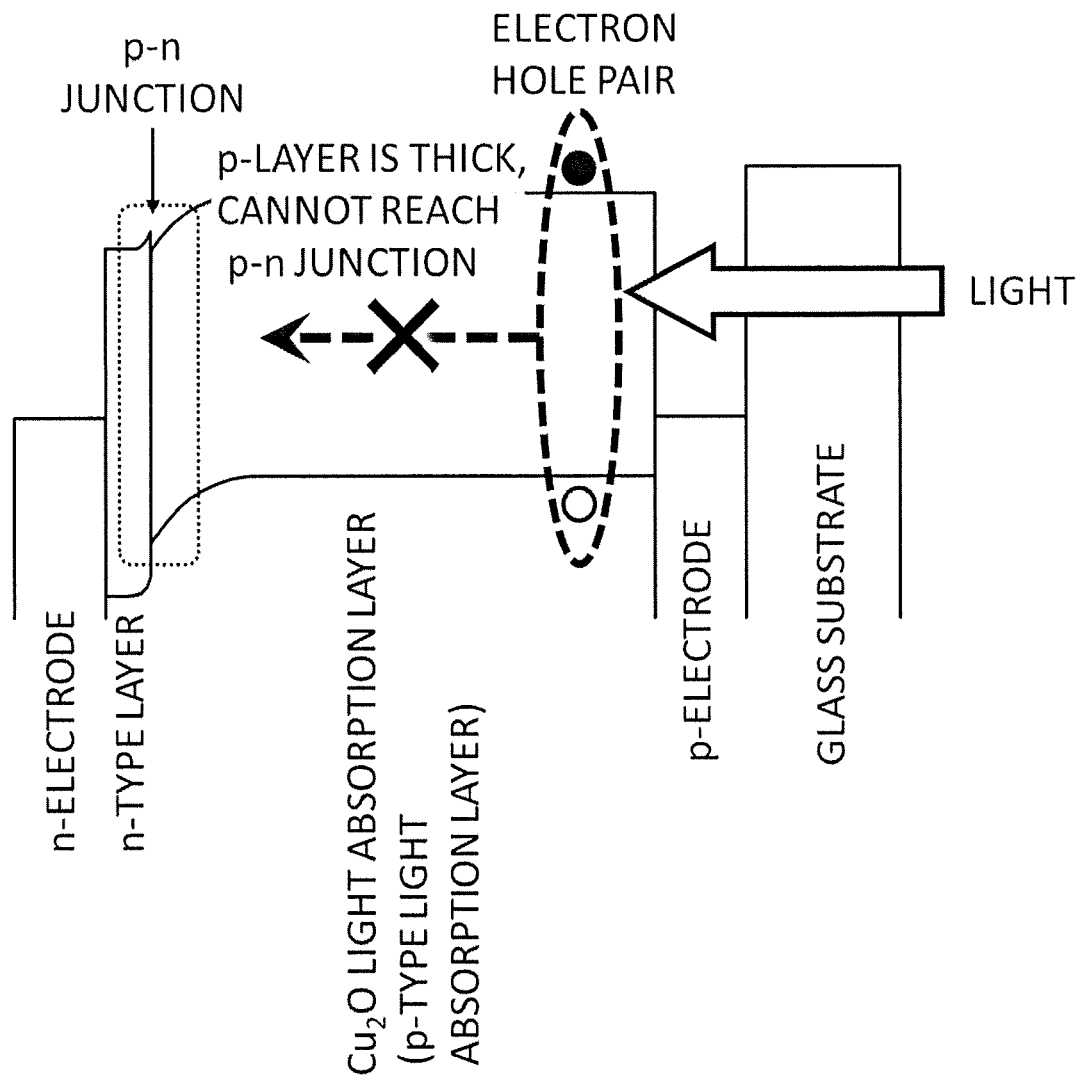
FIG. 4 shows a schematic view of a band profile of the solar cell.

Next, consider the case where sunlight is incident from the glass substrate side. FIG. 3 shows a cross-sectional view of a solar cell of a related art in which light is injected from the p-electrode side according to a conventional example. FIG. 4 shows a schematic view of the band profile of the layers of the $Cu_2O$ solar cell in which the light is injected from the p-electrode side. In this case, the light is absorbed in the $Cu_2O$ layer at a position far from the p-n junction region, so that electron-hole pairs are also generated at positions far from the p-n junction region. The electron-hole pairs need to be diffused over a long distance to the p-n junction region where there is a potential gradient. Assume herein that the film thickness of the light absorption layer is L', then the absorption length is L, so that the average distance D' where the electron-hole pair has to diffuse to the p-n junction region is approximately $D' \fallingdotseq L'-L$. In short, when the light is injected from the glass substrate side, the distance D' is longer than the diffusion length D of the electron-hole pairs, and D'>D. Thus, it is considered that many electron-hole pairs recombine before reaching the p-n junction region, thus reducing conversion efficiency and decreasing the power generation amount.

In accordance with the above results, the inventors have considered to change the configuration in which the p-n interface is moved closer to the glass substrate, so that the electron-hole pairs dissociate into free carriers before recombining, and achieves high efficiency power generation in the superstrate configuration where the light is injected from the glass substrate side. However, in the $Cu_2O$ solar cell of the related art, the p-electrode and the $Cu_2O$ light absorption layer form an ohmic contact when the Au electrode is used as the p-electrode, but the Au electrode is expensive. Further, the light transmissive $Cu_2O$ solar cell cannot be obtained unless the transparent conductive film is used for the p-electrode and the n-electrode. However, a high-resistance junction is created between the p-electrode and the $Cu_2O$ light absorption layer in the solar cell in which the p-electrode is in direct contact with the transparent conductive film. There has been no reported light transmitting superstrate $Cu_2O$ solar cell, in which the light is injected from the n-type electrode side, which achieves the excellent power generation efficiency.

The thickness of the p-type light absorption layer 4 is determined by observing the cross-section with an electron microscope or a step gauge, and is preferably at least 1,000 nm and not more than 10,000 nm.

Preferably, the p-type light absorption layer 4 is formed by, for example, sputtering.

The p-electrode 5 is the electrode in direct contact with the p-type light absorption layer 4. The p-electrode 5 includes a first p-electrode 5a and a second p-electrode 2b. The first p-electrode 5a and the second p-electrode 5b are stacked. The first p-electrode is disposed closer to the p-type light absorption layer 4 than the second p-electrode 5b is.

The first p-electrode 5a is an oxide film made of an Sn-based metal oxide. The first p-electrode 5a is an-electrode in direct contact with the p-type light absorption layer 4. The first p-electrode 5a is disposed between the p-type light absorption layer 4 and the second p-electrode 5b. The p-electrode 5 is preferably a laminated film, because resistivity of the Sn-based metal oxide is higher than the resistivity of another transparent conductive oxide film such as a metal film, an intermetallic compound film, an indium tin oxide, or the like, and generates a loss in power generation due to the resistance component when used as an individual part.

A metal film such as Au or a transparent conductive oxide film such as ITO has been used as an electrode in direct contact with the p-type light absorption layer 4. It is known that when a metal film of Au or the like is used as the p-electrode in direct contact with the p-type light absorption layer 4, the interface between the p-type light absorption layer and the p-electrode forms an ohmic contact with holes. If it is an ohmic contact, although it is low resistance, since Au is expensive, there is a problem of cost. When a transparent conductive film such as indium tin oxide is used as a p-electrode in direct contact with the p-type light absorption layer 4, a Schottky barrier is formed at the interface between the transparent conductive film and the p-type light absorption layer 4. It is known that the conversion efficiency is low because the contact resistance between the p-electrode and the light absorption layer 4 is high.

Figure 5:
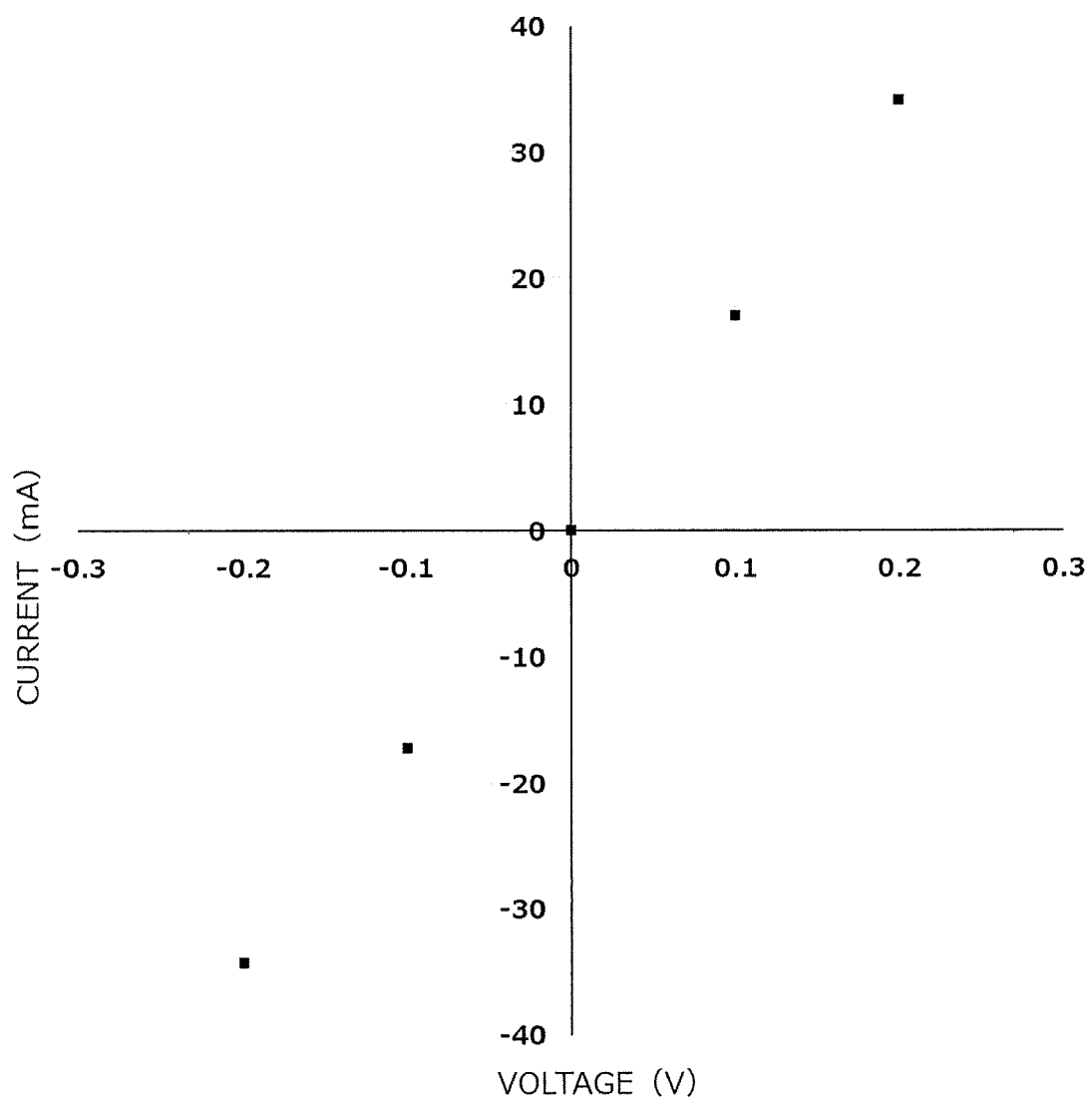
FIG. 5 shows a current-voltage characteristic of a glass-Au—$Cu_2O$—Au element.

The contact between the Au electrode and the p-type light absorption layer 4 is described more specifically. FIG. 5 shows a current-voltage characteristic of a glass-Au—$Cu_2O$—Au element which is formed by forming an Au electrode on the glass substrate and sequentially forming a $Cu_2O$ thin film light absorption layer (p-type light absorption layer) and an opposing Au electrode. It can be seen in the graph that an ohmic current flows with respect to the voltage in this device. Since the Au—$Cu_2O$ interface is known empirically as an ohmic contact to holes, the results in FIG. 5 show that it is reasonable.

Figure 6:
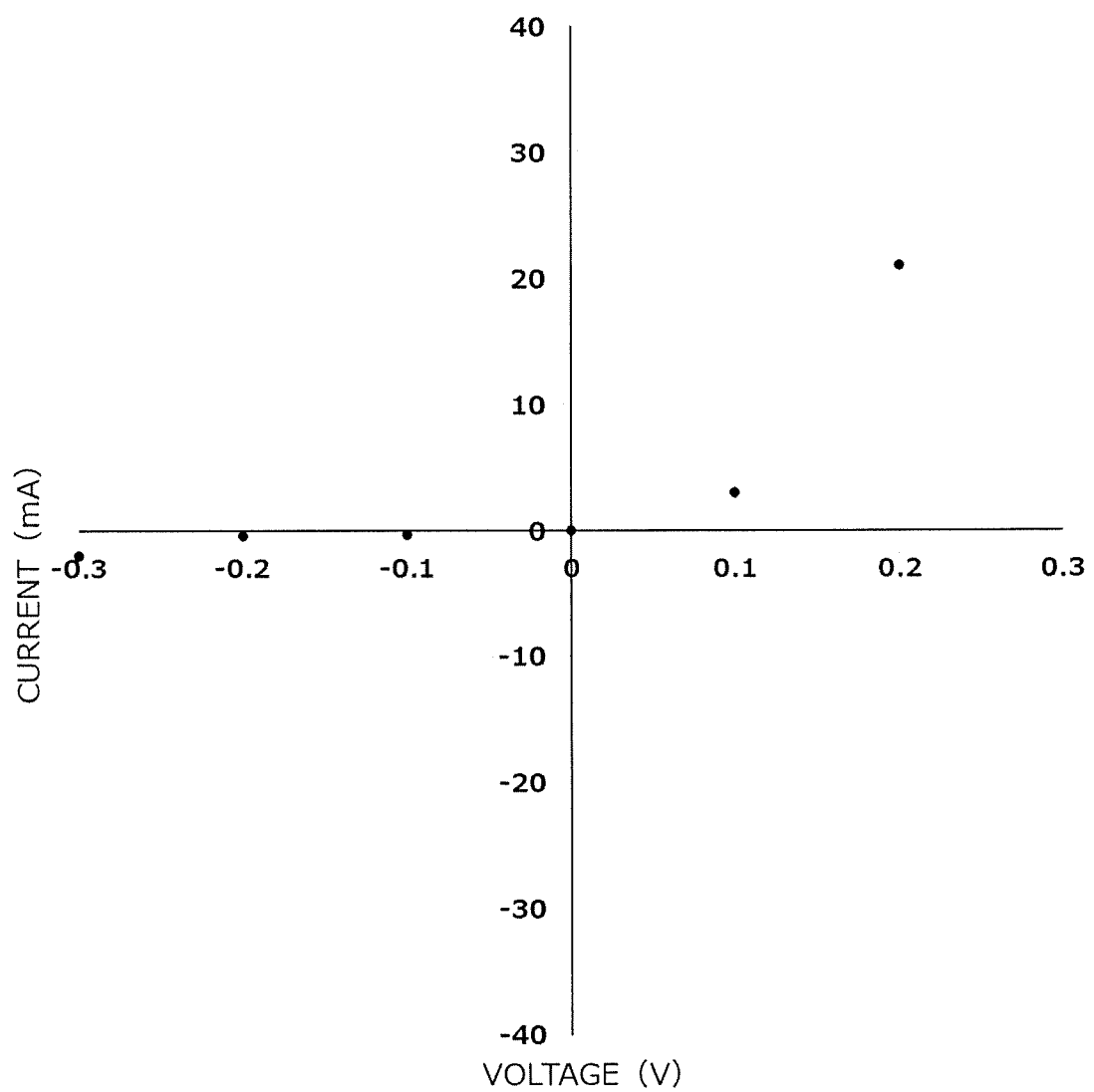
FIG. 6 shows a current-voltage characteristic of a glass-ITO—$Cu_2O$—Au element.

The contact between the ITO electrode and the p-type light absorption layer 4 will be described more specifically. ITO includes Sn, but In is the main component of metal. FIG. 6 shows a current-voltage characteristic of a glass-ITO—$Cu_2O$—Au element in which an ITO electrode is formed on a glass substrate, and a $Cu_2O$ thin film light absorption layer (p-type light absorption layer) and an opposing Au electrode are sequentially formed thereon. From the figure, it is understood that in this element, the rectifying property is shown with respect to the voltage, and the diode current flows. The results in FIG. 6 indicate that the ITO—$Cu_2O$ interface forms a Schottky barrier, as the Au—$Cu_2O$ interface is known empirically as an ohmic contact to holes.

Figure 7:
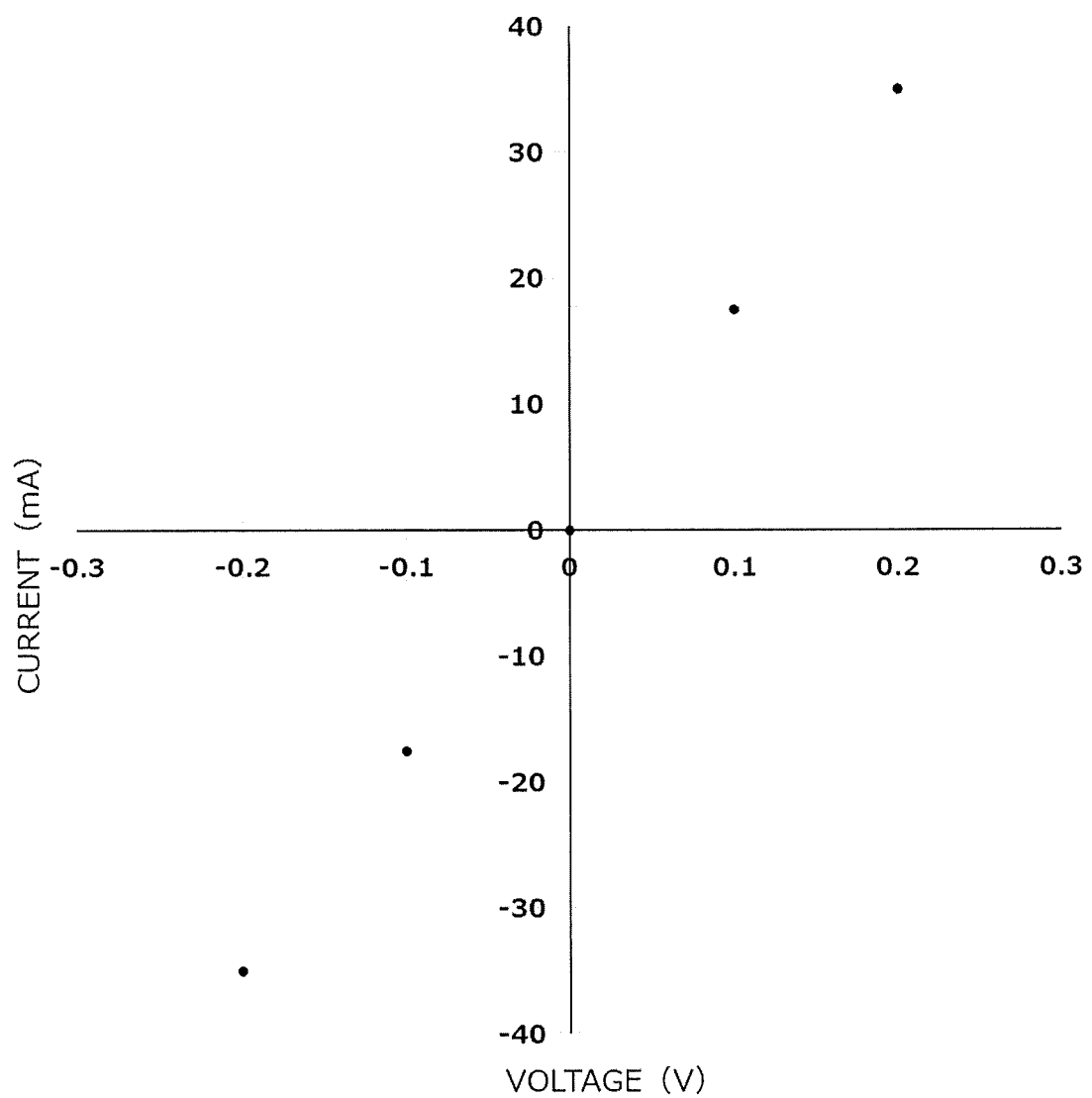
FIG. 7 shows a current-voltage characteristic of a glass-$Sn_2O$—$Cu_2O$—Au element.

The contact between the $SnO_2$ electrode and the p-type light absorption layer 4 is described more specifically. FIG. 7 shows the current-voltage characteristic of a glass-$SnO_2$—$Cu_2O$—Au element in which the $Cu_2O$ thin film light absorption layer is formed on conductive $SnO_2$ (antimony, Sb, added), and Au is further formed thereon as a counter electrode. It is found from the graph that the ohmic current relative to voltage also flows to the voltage in this element. Since the Au—$Cu_2O$ interface is an ohmic contact to holes, the result in FIG. 7 indicate that the $SnO_2$—$Cu_2O$ interface is also an ohmic contact to holes.

As shown in the results of FIGS. 3, 4 and 5, it is preferable that the p-electrode 5 in direct contact with the p-type light absorption layer 4, that is, the first p-electrode 5a is an Sn-based metal oxide. This result is unexpected due to the following reason. The conductivity type of the Sn-based metal oxide is an n-type semiconductor, similar to ITO and the like. It is considered that $SnO_2$ (Sn-based metal oxide), which is n-type and has a relatively low conductivity, is not suitable as a p-electrode which is in direct contact with the p-type light absorption layer. $SnO_2$ (Sn-based metal oxide) is expected to form a Schottky barrier similar to ITO, but an unexpected result has been obtained. Although not known, the reason why the Sn-based metal oxide is in ohmic contact with the p-type light absorption layer 4 may be a tunnel junction between the metal oxide and the p-type light absorption layer 4.

Further, $SnO_2$ is conductive, but $SnO_2$ itself has a low conductivity. However, when FIGS. 5 and 7 are compared, the element using the $SnO_2$ electrode exhibits a current-voltage characteristic similar to that of the element using the Au electrode. This result is also an unexpected from the characteristics of $SnO_2$.

The metal included in the oxide of the first p-electrode 5a may include at least one kind of metal selected from the group consisting of Zn, Al, Ga, In, Si, Ge, Ti, Cu, Sb, Nb, F, and Ta in addition to Sn. These metals other than Sn are doped in tin oxide. For example, by increasing Sb, carriers increase and the tunnel junction between the first p-electrode 5a and the p-type light absorption layer 4 is formed easily. Cu in the p-type light absorption layer 4 may be included in the first p-electrode 5a. In view of the above, it is preferable that the first p-electrode 5a include Cu, Sb, or Cu and Sb, in addition to Sn, among the metals described above. Preferably, therefore, the metals included in the oxide of the first p-electrode 5a are Sn and Sb, Sn and Cu, or Sn, Sb, and Cu. The first p-electrode 5a may be a transparent conductive oxide film which, other than Sn, does not substantially include at least one kind of metal selected from the group consisting of Zn, Al, Ga, In, Si, Ge, Ti, Cu, Sb, Nb, F, and Ta. In other words, the first p-electrode 5a may be a transparent conductive oxide film having the content of Sn equivalent to at least 99 atom % of the metals included in the oxide.

Preferably, at least 90 atom % of the metal included in the oxide of the first p-electrode 5a is Sn. When the Sn concentration in the first p-electrode 5a is low, a Schottky barrier with the p-type light absorption layer 4 is likely to be formed like ITO. From the same viewpoint, at least 95 atom % of the metal included in the oxide of the first p-electrode 5a is more preferably Sn. From the same point of view, a concentration of Sn included in the first p-electrode 5a is preferably at least 29.5 atom % and not more than 33.5%. More preferably, of the metals included in the oxide of the first p-electrode 5a, Sn occupies at least 95 atom % of metals, and not more than 5 atom % of metals is occupied by at least one kind of metal selected from the group consisting of Zn, Al, Ga, In, Si, Ge, Ti, Cu, Sb, Nb, F, and Ta. More preferably, of the metals included in the oxide of the first p-electrode 5a, Sn occupies at least 95 atom % of metals, and at least 0.1 atom % and not more than 5 atom % of metals are Cu, Sb, or Cu and Sb.

The thickness of the first p-electrode 5a is determined by observing its cross-section with the electron microscope or by a step gauge, and is preferably at least 1 nm and not more than 1000 nm. If the first p-electrode 5a is very thin, the p-type light absorption layer 4 easily comes to contact directly with the second p-electrode 5b. If the first p-electrode 5a is very thick, the resistance of the p-electrode 5 is increases, which is not preferable. The range mentioned above is preferable, therefore, from the viewpoint that the entire surface of the first p-electrode 5a facing the p-type light absorption layer 4 are in direct contact with the entire surface of the p-type light absorption layer 4 facing the first p-electrode 5a. From the same point of view, the thickness of the first p-electrode 5a is more preferably at least 5 nm and not more than 300 nm.

The second p-electrode 5b is a conductive film having a resistance lower than the resistance of first p-electrode 5a. The second p-electrode 5b is an electrode which is in direct contact with the first p-electrode 5a, but not with the p-type light absorption layer 4. Preferably, the second p-electrode 5b is a single layer film or a laminated film selected from the group consisting of a metal film, an intermetallic compound film, and a transparent conductive oxide film. The laminated film includes, for example, a form in which different types of films, such as a combination of a metal film and a transparent conductive oxide film, are stacked and a form in which the same type of films, such as a combination of a metal film and a metal film, are stacked. In a case where the solar cell is a multi-junction solar cell or a translucent solar cell, it is preferable that both the p-electrode 5 and the n-electrode 2 are light transmissive to visible light. Preferably, the second p-electrode 5b is the transparent conductive oxide film from the viewpoint of transmitting visible light. In using the metal film for the second p-electrode 5b, light transmittance is lost when a thick metal film is used. Therefore, the thickness of the metal film in the second p-electrode 5b is preferably not more than 10 nm, and more preferably not more than 5 nm.

Preferably, the metal film used for the second p-electrode 5b is a film made of at least one kind of metal selected from the group consisting of Cu, Al, Ag, Mo, W, and Ta. Preferably, the intermetallic compound used for the second p-electrode 5b is a film of an intermetallic compound including at least one kind of metal listed above for the metal film. Preferably, the transparent conductive oxide film used for the second p-electrode 5b is at least one kind film selected from the group consisting of indium tin oxide, aluminum-doped zinc oxide, boron-doped zinc oxide, gallium-doped zinc oxide, indium-doped zinc oxide, aluminum gallium oxide, titanium-doped indium oxide, indium gallium zinc oxide, and hydrogen-doped indium oxide. Preferably, a total concentration of Sn and Sb among metals contained in the second p-electrode 5b is not more than 10 atom %.

The thickness of the second p-electrode 5b is determined by observing its cross-section with the electron microscope or the step gauge, and is typically at least 1 nm and not more than 1 µm, although not particularly limited.

Preferably, the first p-electrode 5a and the second p-electrode 5b are formed by, for example, sputtering.

Figure 8:
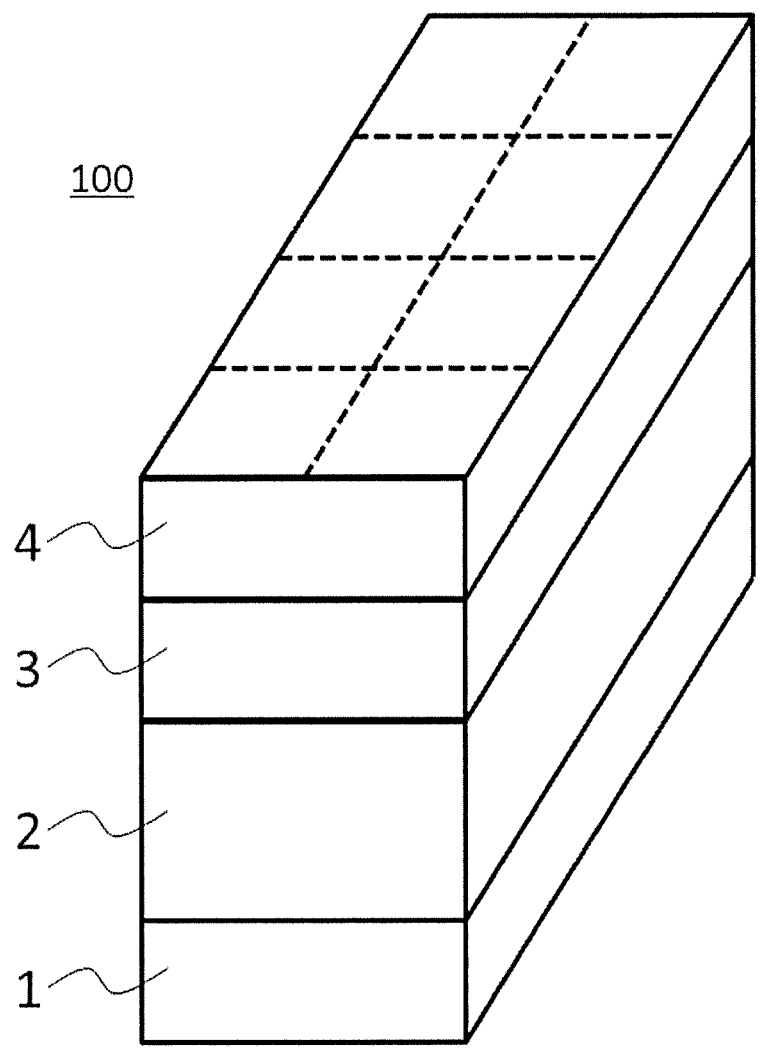
FIG. 8 shows a perspective view of the solar cell of the embodiment.

The elemental composition in the first p-electrode 5a and the second p-electrode 5b can be confirmed by analysis using secondary ion mass spectrometry (SIMS). Analysis is performed by the SIMS in the depth direction from the n-type layer 3 to the p-type light absorption layer 4. Preferably, the elements included in the p-electrode 5 are measured in advance by observing a cross-section of the solar cell using a transmission electron microscope-energy dispersive X-ray spectrometry (TEM EDX). As shown in the perspective view of FIG. 8, the analyzing position is at an area of 78 µm×78 µm located in the center of eight regions obtained by longitudinally dividing the main surface of the n-electrode 2 (surface opposite to the surface facing the n-type layer) into four equal parts and laterally dividing the same surface into two equal parts. The n-electrode 2, the n-type layer 3, and the p-type light absorption layer can also be analyzed by the same method.

The sealing layer 6 is a layer present on the p-electrode 5. In FIG. 1, the sealing layer 6 is in direct contact with the p-electrode 5. Preferably, the sealing layer 6 is a resin layer having light transmittance or a layer including an inorganic thin film layer having a thickness of at least 100 µm with light transmittance. More specifically, the resin layer may be EVA (Ethylene vinyl acetate), polyimide, and the inorganic thin film layer is, for example, $SiN_x$, $SiO_x$, $SiO_xN_y$, $AlO_x$, $AlO_xN_y$, or the like, although not particularly limited. The sealing layer 6 may be in the multilayer structure of a transparent resin layer and an inorganic thin film layer. The sealing layer 6 may cover the entire outer periphery of the n-electrode 2, the n-type layer 3, the p-type light absorption layer 4, and the p-electrode 5.

Second Embodiment

Figure 9:
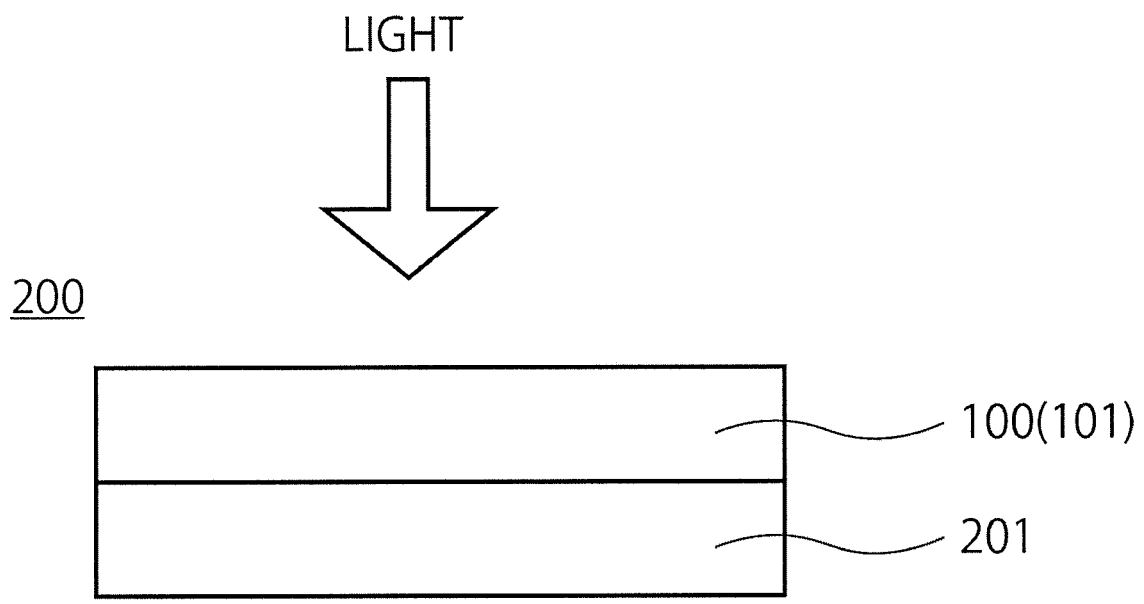
FIG. 9 shows a cross-sectional view of a multi-junction solar cell of the embodiment.

A second embodiment relates to a multi-junction solar cell. FIG. 9 shows a conceptual cross-sectional view of a multi-junction solar cell according to a second embodiment. A multi-junction solar cell 200 of FIG. 9 includes the solar cell (first solar cell) 100 of the first embodiment disposed on the light incident side and a second solar cell 201. The p-type light absorption layer of the second solar cell 201 has a band gap smaller than the band gap of the p-type light absorption layer 4 of the solar cell 100 of the first embodiment. Note that the multi-junction solar cell of the present embodiment also includes a solar cell formed by bonding at least three solar cells. Since the second solar cell 201 does not include a glass substrate, the multi-junction solar cell 200 includes only one glass substrate. Thus, the multi-junction solar cell 200 is lightweight and uses the solar cell 100 of the first embodiment, the multi-junction solar cell 200 can also achieve an excellent conversion efficiency.

In the second embodiment, the band gap of the p-type light absorption layer 4 of a first solar cell 100 is about 2.0 eV-2.2 eV, so that the band gap of the light absorption layer of a second solar cell 200 is preferably at least 1.0 eV and not more than 1.6 eV. Preferably, the light absorption layer of the second solar cell is a kind of layer selected from the group consisting of at least one kind of a compound semiconductor layer, which is selected of a group consisting of GIGS-based or CdTe-based compound semiconductor layers having high content of In, crystalline silicon, and a perovskite-type compound.

Third Embodiment

Figure 10:
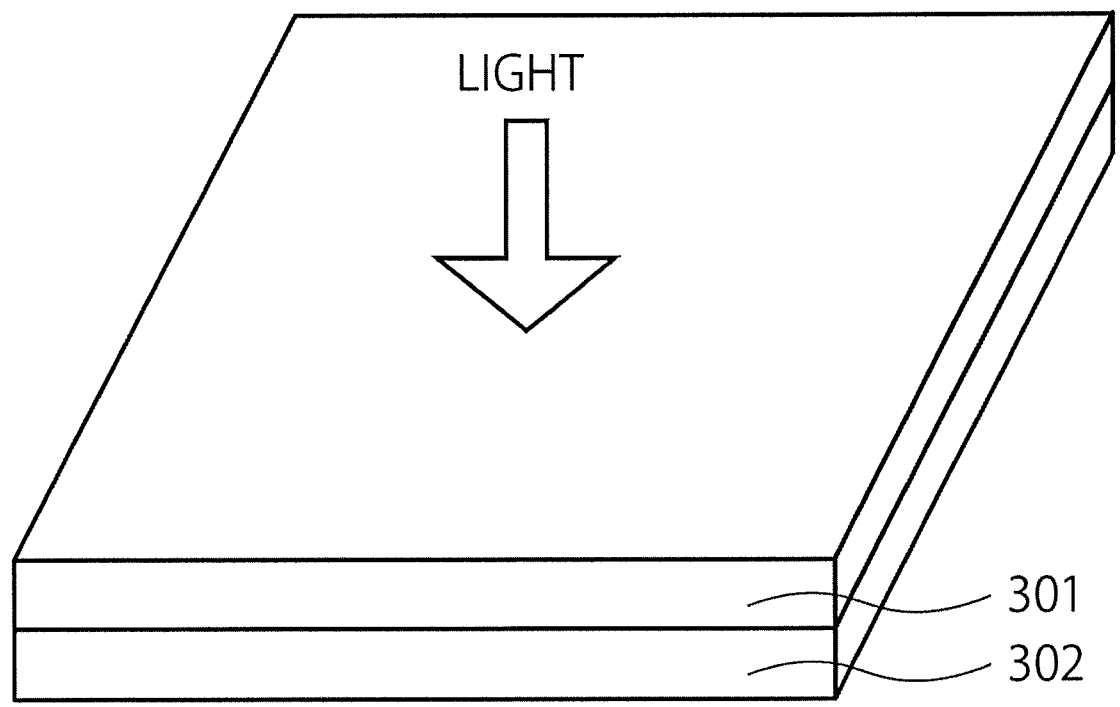
FIG. 10 shows a perspective view of a solar cell module of the embodiment.

A third embodiment relates to a solar cell module. FIG. 10 shows a perspective view of a solar cell module 300 according to a third embodiment. The solar cell module 300 of FIG. 10 is a solar cell module formed by stacking a first solar cell module 301 and a second solar cell module 302. The first solar cell module 301 is disposed on the light incident side and uses the solar cell 100 of the first embodiment. The second solar cell module 302 uses the second solar cell 201. Although the first solar cell module 301 includes the substrate 1, the second solar cell module 302 does not include the glass substrate, so the number of glass substrates included in the solar cell module 300 is one. Therefore, the solar cell module 300 is lightweight and uses the solar cell 100 of the first embodiment, so that the solar cell module 300 is also excellent in conversion efficiency.

Figure 11:
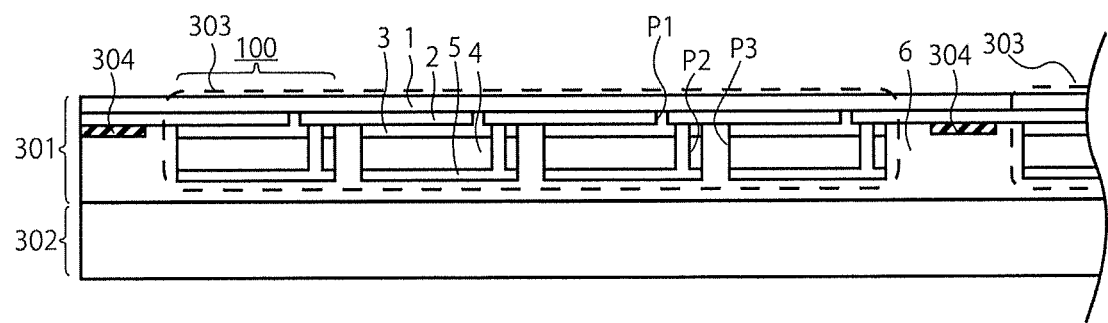
FIG. 11 shows a cross-sectional view of the solar cell module of the embodiment.

FIG. 11 shows a cross-sectional view of the solar cell module 300. FIG. 11 shows the structure of the first solar cell module 301 in detail, but does not show the structure of the second solar cell module 302. In the second solar cell module 301, the structure of the solar cell module is appropriately selected according to the light absorption layer of the solar cell to be used. The solar cell module of FIG. 11 includes a plurality of submodules 303, each surrounded by a broken line, in which a plurality of solar cells 100 (solar cells) are electrically connected in series side by side in the lateral direction. The submodules 303 are electrically connected in parallel or in series. The adjacent submodules 303 are electrically connected via a bus bar 304.

The solar cells 100 are scribed to allow the adjacent solar cells 100 to be connected at the upper side n-electrode 2 and the lower side p-electrode 5. Similarly to the solar cell 100 of the first embodiment, the solar cell 100 of the third embodiment also receives the incident light from the substrate 1 side, and includes the substrate 1, the n-electrode 2, the n-type layer 3, the p-type light absorption layer 4, and the p-electrode 5. Both ends of the solar cell 100 in each submodule 303 are connected to the bus bar 304, and the bus bars 304 preferably connect the plurality of submodules 303 electrically in parallel or in series to adjust the output voltage with the second solar cell module 302.

Fourth Embodiment

Figure 12:
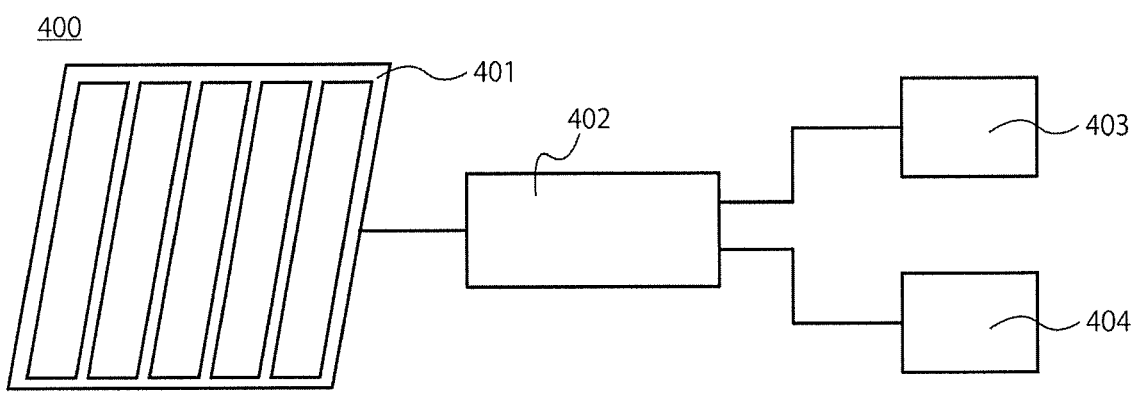
FIG. 12 shows the structure of a solar power generation system.

A fourth embodiment relates to a solar power generation system. The solar cell module of the third embodiment can be used as a generator for generating power in the solar power generation system of the fourth embodiment. The solar power generation system according to the present embodiment performs power generation using the solar cell module, and specifically includes a solar cell module that generates power, a unit that converts the generated electricity into power, and a storage unit for storing the generated electricity or a load for consuming the generated electricity. FIG. 12 shows the structure of a solar power generation system 400 of the present embodiment. The solar power generation system of FIG. 12 includes a solar cell module 401 (300), a converter 402, a storage battery 403, and a load 404. The storage battery 403 or the load 404 may be omitted. The load 404 may be configured to be able to use the electric energy stored in the storage battery 403. The converter 402 is a device, such as a DC to DC converter, a DC to AC converter, or an AC to AC converter, which includes a circuit or element for performing power conversion such as voltage transformation or DC to AC conversion. The configuration of the converter 402 may be any suitable configuration depending on the configuration of the generated voltage, the storage battery 403, or the load 404.

The solar battery cells included in the submodule 301, which received light, in the solar cell module 300 generates electric power, and the electric power is converted by the converter 402 to be stored in the storage battery 403 or consumed in the load 404. Preferably, the solar cell module 401 includes a sunlight tracking driving device for always directing the solar cell module 401 toward the sun or a light collector for collecting sunlight, or adds a device for further improving the power generation efficiency.

Preferably, the solar power generation system 400 is used in real estate including residences, commercial facilities or factories, or used for movable property such as an aircraft, an electronic device, and the like. By using the solar cells having excellent conversion efficiency of the present embodiment in the solar cell module, it is expected to provide the solar cell module which is lightweight and achieves an increased amount of power generation.

Hereinafter, the present disclosure is described more specifically by examples, but the present disclosure is not limited to the following examples.

Example 1

A solar cell of Example 1 was an example of a light-transmitting and thin-film $Cu_2O$ solar cell. On a glass substrate, an AZO transparent conductive film was deposited as the n-electrode on which ZnMgO oxide was deposited as the n-type layer. Then, the deposited layers were heated at 500° C. by sputtering in an argon gas atmosphere to form a $Cu_2O$ light absorption layer. After that, an antimony-doped tin oxide (ATO) transparent conductive film and ITO were sequentially deposited on the light absorption layer as the p-electrode. Then, an $SiN_x$ film was formed as the sealing layer on which a resin layer was formed.

Since the p-n interface was provided closer to the glass substrate side, the power generation characteristic did not deteriorate and the efficiency was improved, even when the sunlight was injected from the glass substrate side.

Comparative Example 1

A solar cell of Comparative Example 1 is an example of a light-transmitting and thin-film type $Cu_2O$ solar cell. In Comparative Example 1, layers were stacked reversely compared to the layer structure of Example 1. First, ITO and ATO were sequentially deposited on the glass substrate as the p-electrode on the glass substrate. Then, the deposited layers were heated at 500° C. by sputtering in an argon gas atmosphere to form a $Cu_2O$ light absorption layer. After that, ZnMgO oxide is deposited on the light absorption layer as the n-type layer on which AZO was deposited as the n-electrode. Finally, an $SiN_x$ film was formed as a sealing layer on which a resin layer was formed.

Since the p-n interface was formed at a position away from the glass substrate, the sunlight was injected from the glass substrate side, and the short circuit current and the open circuit voltage were reduced to half or less than half as compared to Example 1.

Thus, it has proved that, in the superstrate structure in which the sunlight was injected from the glass substrate side, it was necessary to form the p-n interface closer to the glass substrate side.

Example 2

A solar cell of Example 2 was an example of the light-transmitting and thin-film type $Cu_2O$ solar cell. On the glass substrate, the AZO transparent conductive film was deposited as the n-electrode on which ZnGeO oxide was deposited as the n-type layer. Then, the deposited layers were heated at 500° C. by sputtering in an argon gas atmosphere to form a $Cu_2O$ light absorption layer. After that, the ATO transparent conductive film and ITO were sequentially deposited on the light absorption layer as the p-electrode. Then, an $SiN_x$ film was formed as the sealing layer on which a resin layer was formed.

Since the p-n interface was provided closer to the glass substrate side, the power generation characteristic did not deteriorate and the efficiency was improved, even when the sunlight was injected from the glass substrate side.

Example 3

A solar cell of Example 3 was an example of a light-transmitting and thin-film type $Cu_2O$ solar cell. On the glass substrate, the AZO transparent conductive film was deposited as the n-electrode on which ZnOS was deposited as the n-type layer. Then, the deposited layers were heated at 500° C. by sputtering in an argon gas atmosphere to form a $Cu_2O$ light absorption layer. After that, the ATO transparent conductive film and ITO were sequentially deposited on the light absorption layer as the p-electrode. Then, an $SiN_x$ film was formed as the sealing layer on which a resin layer was formed.

Since the p-n interface was provided closer to the glass substrate side, the power generation characteristic did not deteriorate and the efficiency was improved, even when the sunlight was injected from the glass substrate side.

Example 4

A solar cell of Example 4 was an example of a light-transmitting and thin-film type $Cu_2O$ solar cell. On the glass substrate, an ITO transparent conductive film was deposited as the n-electrode on which ZnMgO oxide was deposited as the n-type layer. Then, the deposited layers were heated at 500° C. by sputtering in an argon gas atmosphere to form a $Cu_2O$ light absorption layer. After that, the ATO transparent conductive film and ITO were sequentially deposited on the light absorption layer as the p-electrode. Then, an $SiN_x$ film was formed as the sealing layer on which a resin layer was formed.

Since the p-n interface was provided closer to the glass substrate side, the power generation characteristic did not deteriorate and the efficiency was improved, even when the sunlight was injected from the glass substrate side.

Example 5

A solar cell of Example 5 was an example of a light-transmitting and thin-film type $Cu_2O$ solar cell. On the glass substrate, the ITO transparent conductive film was deposited as the n-electrode on which ZnGeO oxide was deposited as the n-type layer. Then, the deposited layers were heated at 500° C. by sputtering in an argon gas atmosphere to form a $Cu_2O$ light absorption layer. After that, the ATO transparent conductive film and ITO were sequentially deposited on the light absorption layer as the p-electrode. Then, an $SiN_x$ film was formed as the sealing layer on which a resin layer was formed.

Since the p-n interface was provided closer to the glass substrate side, the power generation characteristic did not deteriorate and the efficiency was improved, even when the sunlight was injected from the glass substrate side.

Example 6

A solar cell of Example 6 was an example of a light-transmitting and thin-film type $Cu_2O$ solar cell. On the glass substrate, the ITO transparent conductive film was deposited as the n-electrode on which ZnOS was deposited as the n-type layer. Then, the deposited layers were heated at 500° C. by sputtering in an argon gas atmosphere to form a $Cu_2O$ light absorption layer. After that, the ATO transparent conductive film and ITO were sequentially deposited on the light absorption layer as the p-electrode. Then, an $SiN_x$ film was formed as the sealing layer on which a resin layer was formed.

Since the p-n interface was provided closer to the glass substrate side, the power generation characteristic did not deteriorate and the efficiency was improved, even when the sunlight was injected from the glass substrate side.

Example 7

A solar cell of Example 7 was an example of a light-transmitting and thin-film type $Cu_2O$ solar cell. On the glass substrate, an ITO transparent conductive film was deposited as the n-electrode on which ZnMgO oxide was deposited as the n-type layer. Then, the deposited layers were heated at 500° C. by sputtering in an argon gas atmosphere to form a $Cu_2O$ light absorption layer. After that, a tin oxide transparent conductive film and ITO were sequentially deposited on the light absorption layer as the p-electrode. Then, the $SiN_x$ film was formed as the sealing layer on which the resin layer was formed.

Since the p-n interface was provided closer to the glass substrate side, the power generation characteristic did not deteriorate and the efficiency was improved, even when the sunlight was injected from the glass substrate side.

Example 8

A solar cell of Example 8 was an example of a light-transmitting and thin-film type $Cu_2O$ solar cell. On the glass substrate, the ITO transparent conductive film was deposited as the n-electrode on which ZnGeO oxide was deposited as the n-type layer. Then, the deposited layers were heated at 500° C. by sputtering in an argon gas atmosphere to form a $Cu_2O$ light absorption layer. After that, a tin oxide transparent conductive film and ITO were sequentially deposited on the light absorption layer as the p-electrode. Then, an $SiN_x$ film was formed as the sealing layer on which a resin layer was formed.

Since the p-n interface was provided closer to the glass substrate side, the power generation characteristic did not deteriorate and the efficiency was improved, even when the sunlight was injected from the glass substrate side.

Example 9

A solar cell of Example 9 was an example of a light-transmitting and thin-film type $Cu_2O$ solar cell. On the glass substrate, the ITO transparent conductive film was deposited as the n-electrode on which ZnOS was deposited as the n-type layer. Then, the deposited layers were heated at 500° C. by sputtering in an argon gas atmosphere to form a $Cu_2O$ light absorption layer. After that, the tin oxide transparent conductive film and ITO were sequentially deposited on the light absorption layer as the p-electrode. Then, an $SiN_x$ film was formed as the sealing layer on which a resin layer was formed.

Since the p-n interface was provided closer to the glass substrate side, the power generation characteristic did not deteriorate and the efficiency was improved, even when the sunlight was injected from the glass substrate side.

Example 10

A solar cell of Example 10 was an example of the multi-junction solar cell using the solar cell of Example 1 as the top cell. The top cell was configured similarly to the configuration of Example 1.

To form the multi-junction solar cell, single crystal Si having a conversion efficiency of 22.2% in itself was used as the bottom cell, and the top cell and the bottom cell were stacked and electrically connected in parallel. In the multi-junction solar cell of Example 10, only one glass substrate was used. The number cells, m, of the top cell and the number cells, n, of the bottom cell were adjusted to satisfy m×output V (top cell)=n×V (bottom cell), so that the output voltages of both cells match.

As a result of investigating the solar cell characteristic, it has been found that a high characteristic of the efficiency of 10% for the top cell alone and the efficiency of 28.1% for the multi-junction solar cell were obtained by emitting 1 sun simulated sunlight.

Example 11

The solar cell of Example 11 was an example of the multi-junction solar cell using the solar cell of Example 5 as the top cell. The top cell is configured similarly to the configuration of Example 5.

To form the multi-junction solar cell, single crystal Si having a conversion efficiency of 22.1% in itself was used as the bottom cell, and the top cell and the bottom cell were stacked and electrically connected in parallel. In the multi-junction solar cell of Example 11, only one glass substrate was used. The number cells, m, of the top cell and the number cells, n, of the bottom cell were adjusted to satisfy m×output V (top cell)=n×V (bottom cell), so that the output voltages of both cells match.

As a result of investigating the solar cell characteristic, it has been found that a high characteristic of the efficiency of 9.9% for the top cell alone and the efficiency of 27.6% for the multi-junction solar cell were obtained by emitting 1 sun simulated sunlight.

Example 12

The solar cell of Example 12 was an example of the multi-junction solar cell using the solar cell of Example 5 as the top cell. The top cell is configured similarly to the configuration of Example 9.

To form the multi-junction solar cell, single crystal Si having a conversion efficiency of 22.7% in itself was used as the bottom cell, and the top cell and the bottom cell were stacked and electrically connected in parallel. In the multi-junction solar cell of Example 12, only one glass substrate was used. The number cells, m, of the top cell and the number cells, n, of the bottom cell were adjusted to satisfy m×output V (top cell)=n×V (bottom cell), so that the output voltages of both cells match.

As a result of investigating the solar cell characteristic, it has been found that a high characteristic of the efficiency of 11.8% for the top cell alone and the efficiency of 29.7% for the multi-junction solar cell were obtained by emitting 1 sun simulated sunlight.

In the specification described above, some elements are represented only by element symbols.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solar cell, comprising:
a substrate;
an n-electrode;
an n-type layer;
a p-type light absorption layer Which is a semiconductor of a Cu-based oxide; and
a p-electrode including Sn-based metal oxide, wherein
the n-electrode is disposed between the substrate and the n-type layer,
the n-type layer is disposed between the n-electrode and the p-type light absorption layer,
the p-type light absorption layer is disposed between the n-type layer and the p-electrode,
the n-type layer is disposed closer to a light incident side than the p-type light absorption layer,
the p-electrode is not in direct contact with the substrate,
the substrate is a single substrate included in the solar cell,
the p-electrode includes a first p-electrode and a second p-electrode,
the first p-electrode and the second p-electrode are stacked,
the first p-electrode is in direct contact with the p-type light absorption layer,
the first p-electrode is an Sn-based metal oxide, and
the metal of the first p-electrode includes at least Sn, Sb, and Cu.

2. The cell according to claim 1, wherein
the second p-electrode is a single layer film or a laminated film made of material selected from the group consisting of a metal film, an intermetallic compound film, and a transparent conductive oxide film,
the metal film is made of at least one kind of metal selected from the group consisting of Cu, Al, Ag, Mo, W, and Ta,
the intermetallic compound film is a film of an intermetallic compound including at least one kind of the metal,
the transparent conductive oxide film is at least one kind film selected from the group consisting of indium tin oxide, aluminum-doped zinc oxide, boron-doped zinc oxide, gallium-doped zinc oxide, indium-doped zinc oxide, aluminum gallium oxide, titanium-doped indium oxide, indium gallium zinc oxide, and hydrogen-doped indium oxide.

3. The cell according to claim 1, wherein the n-electrode and the p-electrode are light transmissive to visible light.

4. The cell according to claim 1, wherein a thickness of the first p-electrode is at least 1 nm and not more than 1,000 mm.

5. The cell according to claim 1, wherein at least 90 atom % of the metals included in the first p-electrode is Sn.

6. The cell according to claim 1, wherein at least 95 atom % of the metals included in the first p-electrode is Sn, and at least 0.1 atom % and less than 5 atom % is Sb.

7. The cell according to claim 1, wherein a total concentration of Sn and Sb of the metals included in the second p-electrode is not more than 10 atom %.

8. The cell according to claim 1, wherein
the p-type light absorption layer is a layer of an oxide represented by $Cu_aM_bO_c$, where M is at least one kind of material selected from the group consisting of Sn, Sb, Ag, Li, Na, K, Cs, Rb, Al, Ga, In, Zn, Mg, and Ca, and a, b, and c satisfy $1.80 \leq a \leq 2.01$, $0.00 \leq b \leq 0.20$ and $0.98 \leq c \leq 1.02$.

9. A solar cell module using the solar cell according to claim 1 and a solar cell including a light absorption layer having a band gap smaller than a band gap of the p-type light absorption layer of the solar cell according to claim 1.

10. The solar cell according to claim 1, wherein the n-electrode is disposed closer to a light incident side than the p-electrode.

11. The solar cell according to claim 1, further comprising a sealing layer,
wherein the sealing layer includes an inorganic thin film layer having a thickness of at least 100 μm with light transmittance.

12. A multi-junction solar cell, comprising:
the solar cell according to claim 1; and
a solar cell including a p-type light absorption layer having a band gap smaller than a band gap of the p-type light absorption layer of the solar cell according to claim 1.

13. The cell according to claim 12, wherein the p-type light absorption layer of the solar cell having a band gap smaller than a band gap of the p-type light absorption layer of the solar cell according to claim 1 is made of a kind of material selected from the group consisting of a compound semiconductor layer, crystalline silicon, and a perovskite-type compound.

14. The cell according to claim 12, wherein the substrate is a single substrate included in the multi-junction solar cell.

15. A solar cell module using the solar cell according to claim 1.

16. The cell module according to claim 15, wherein the substrate is a single substrate included in the solar cell module.

17. A solar power generation system that performs solar power generation using the solar cell module of claim 16.

* * * * *